US006535536B2

United States Patent
Fukunaga et al.

(10) Patent No.: US 6,535,536 B2
(45) Date of Patent: Mar. 18, 2003

(54) SEMICONDUCTOR LASER ELEMENT

(75) Inventors: Toshiaki Fukunaga, Kaisei-machi (JP);
Kenji Matsumoto, Kaisei-machi (JP);
Mitsugu Wada, Kaisei-machi (JP)

(73) Assignee: Fuji Photo Film Co., Ltd., Kanagawa-Ken (JP)

( * ) Notice: Subject to any disclaimer, the term of this patent is extended or adjusted under 35 U.S.C. 154(b) by 63 days.

(21) Appl. No.: 09/828,888

(22) Filed: Apr. 10, 2001

(65) Prior Publication Data
US 2001/0028668 A1 Oct. 11, 2001

(30) Foreign Application Priority Data

Apr. 10, 2000 (JP) .................................. 2000-107462
May 29, 2000 (JP) .................................. 2000-157844

(51) Int. Cl.[7] ................................................ H01S 5/00
(52) U.S. Cl. ........................................... 372/45; 372/45
(58) Field of Search ........................................ 372/43–50

(56) References Cited

U.S. PATENT DOCUMENTS

| 5,042,043 | A | * | 8/1991 | Hatano et al. | .................. | 372/45 |
| 5,740,192 | A | * | 4/1998 | Hatano et al. | ............... | 257/101 |
| 6,015,979 | A | * | 1/2000 | Sugiura et al. | ............... | 257/103 |
| 6,028,877 | A | * | 2/2000 | Kimura | ........................ | 372/45 |
| 6,031,858 | A | * | 2/2000 | Hatakoshi et al. | ............ | 372/26 |
| 6,067,309 | A | * | 5/2000 | Onomura et al. | .............. | 372/45 |
| 6,147,364 | A | * | 11/2000 | Itaya et al. | .................. | 257/102 |
| 6,252,894 | B1 | * | 6/2001 | Sasanuma et al. | ............. | 372/44 |
| 6,285,696 | B1 | * | 9/2001 | Bour et al. | ................... | 257/14 |

OTHER PUBLICATIONS

Fukunaga, Toshiaki et al, InGaN/ GaN/ AlGaN–Based Laser Diodes Grown on GaN Substrates with a Fundamental Transverse Mode, Jpn. J. Appl. Phys. vol. 37 (1998) pp. L1020–L022.

* cited by examiner

*Primary Examiner*—Paul Ip
*Assistant Examiner*—Tuan N Nguyen
(74) *Attorney, Agent, or Firm*—Sughrue Mion, PLLC

(57) ABSTRACT

A semiconductor laser element capable of reducing an element resistance and producing a beam of high quality includes: an n-$Ga_{1-z4}Al_{z4}N$ composition gradient layer provided between an n-GaN contact layer and an n-$Ga_{1-z1}Al_{z1}N$/GaN superlattice clad layer; an n-$Ga_{1-z5}Al_{z5}N$ composition gradient layer provided between the n-$Ga_{1-z1}Al_{z1}N$/GaN superlattice clad layer and an n- or i-$Ga_{1-z2}Al_{z2}N$ optical waveguide layer; a p-$Ga_{1-z5}Al_{z5}N$ composition gradient layer provided between a p- or i-$Ga_{1-z2}Al_{z2}N$ optical waveguide layer and a p-$Ga_{1-z1}Al_{z1}N$ superlattice gradient layer; and a p-$Ga_{1-z4}Al_{z4}N$ composition gradient layer provided between a p-$Ga_{1-z1}Al_{z1}N$/GaN superlattice upper clad layer and a p-GaN contact layer. Z4 of the n-$Ga_{1-z4}Al_{z4}N$ composition gradient layer is continuously changed from 0 to a composition corresponding to the band gap of the $Ga_{1-z1}Al_{z1}N$/GaN superlattice clad layer. Z5 in the $Ga_{1-z5}Al_{z5}N$ composition gradient layer is continuously changed from z2 to a composition corresponding to the band gap of the $Ga_{1-z1}Al_{z1}N$/GaN superlattice clad layer.

18 Claims, 6 Drawing Sheets

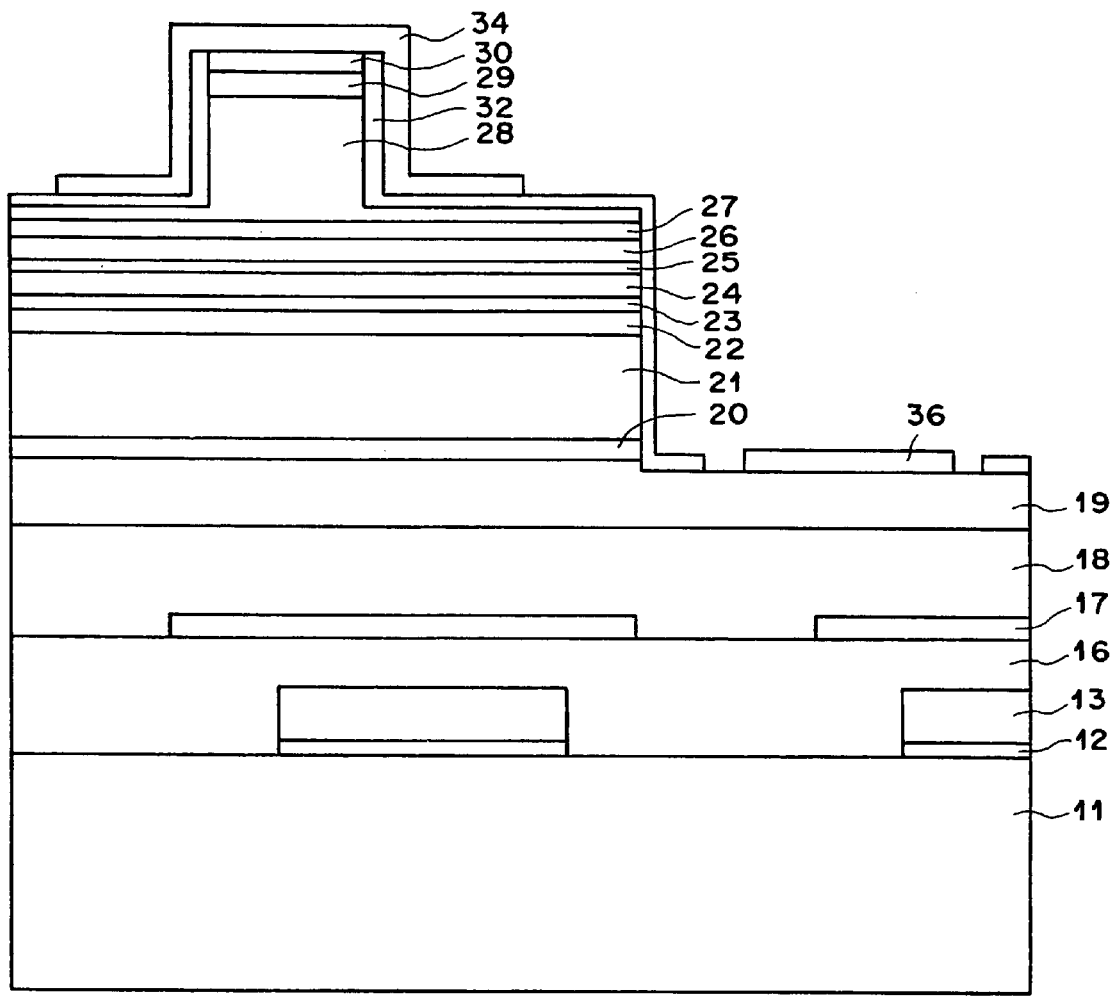
F I G. 1

BAND GAP ENERGY

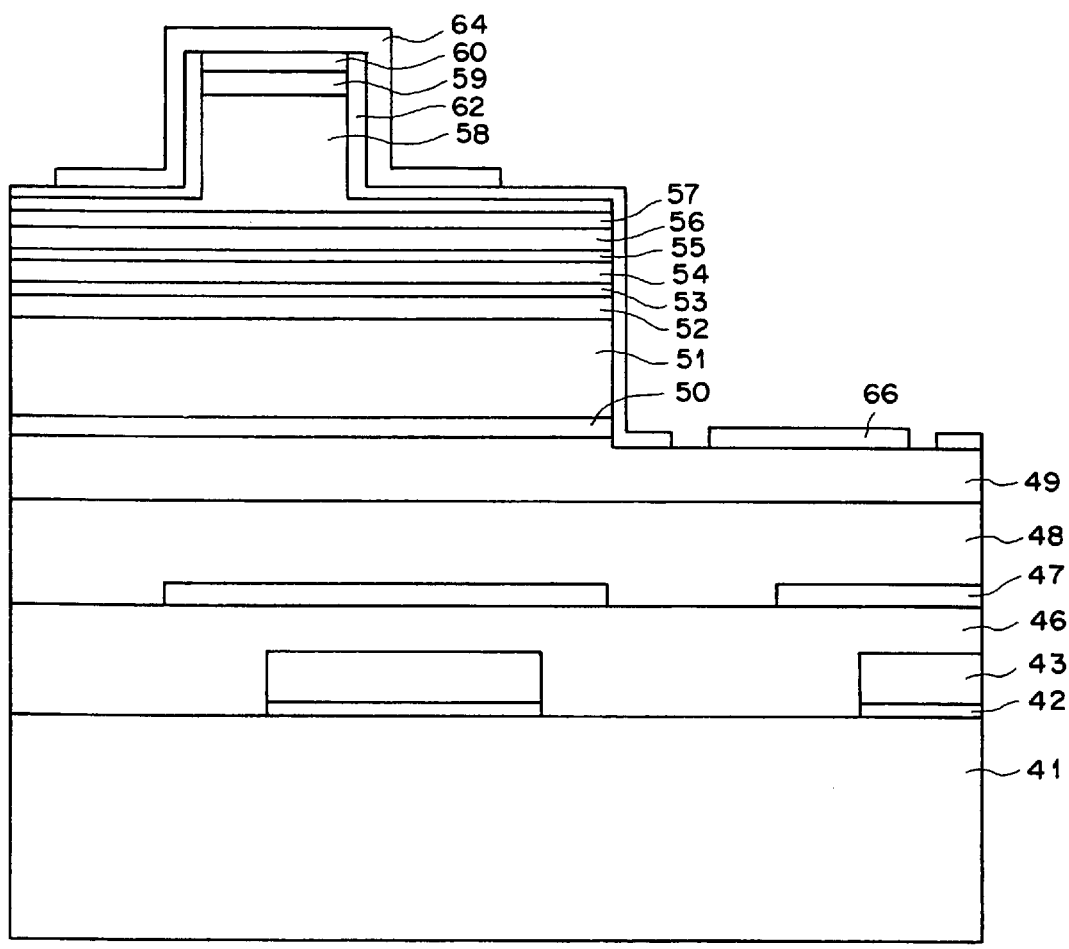
F I G. 4

SEMICONDUCTOR LASER ELEMENT

BACKGROUND OF THE INVENTION

1. Field of the Invention

The invention relates to a semiconductor laser element and, in particular, to a semiconductor laser element having a semiconductor layer including an active layer formed a GaN layer.

2. Description of the Related Art

In the field of manufacturing a high-density optical disc memory or printing using a photosensitive material, a semiconductor laser of 400 nm band having a micro-spot is expected to oscillate a fundamental transverse mode by a highly reliable Gaussian beam.

Disclosed in Jpn. J. Appl. Phys., Vol. 37, pp. L1020, issued in 1998 is "InGaN/GaN/AlGaN-Based Laser Diodes Grown GaN Substrates with a Fundamental Transverse Mode" by Nakamura et al. This is formed as follows: a GaN layer is formed on a sapphire substrate and then the thick GaN film formed by the use of selective growth by using $SiO_2$ as a mask is removed to make a GaN substrate, and on the GaN substrate are formed an n-GaN buffer layer, an n-InGaN crack preventing layer, an n-AlGaN/GaN modulation doped superlattice clad layer, an n-GaN optical waveguide layer, an n-InGaN/InGaN multiple quantum well active layer, a p-AlGaN carrier block layer, a p-GaN optical waveguide layer, a p-AlGaN/GaN modulation doped superlattice clad layer, and a p-GaN contact layer. However, in this case, a refractive index guiding type structure is formed by forming a ridge structure of about 2 μm and this semiconductor laser can produce only the fundamental transverse mode oscillation, at most, of about 30 mW because it is very difficult to control the depth of etching. Further, although a try to reduce an element resistance is made by the use of the modulation doped superlattice clad layer, the element resistance is not sufficiently reduced and hence the reliability of the element is observed to be degraded by the joule heat generated when the element is operated.

As described above, the above-mentioned structure presents a problem that a single mode laser having a small contact area with a contact layer is affected in a practical use by heat generation because the element resistance is large.

SUMMARY OF THE INVENTION

The invention has been made in view of the above problem, and it is an object of the invention to provide a semiconductor laser element producing a Gaussian beam of high quality having high reliability to a high power by reducing an element resistance and preventing the effect of heat generation.

A first semiconductor laser element in accordance with the invention is composed of a GaN layer and at least a lower clad layer, a lower optical waveguide layer, an active layer, an upper optical waveguide layer, an upper clad layer, and a GaN contact layer all of which are laminated on the GaN layer in this order, is provided with a current injection window above the active layer, and is further composed of a first AlGaN composition gradient layer which is formed between the GaN layer and the lower clad layer so that a band gap thereof continuously changes from the GaN layer to the lower clad layer and a second AlGaN composition gradient layer which is formed between the upper clad layer and the GaN contact layer so that a band gap thereof continuously changes from the upper clad layer to the GaN contact layer.

Further, the first semiconductor laser element in accordance with the invention may be composed of a third AlGaN composition gradient layer which is formed between the lower clad layer and the lower optical waveguide layer so that a band gap thereof continuously changes from the lower clad layer to the lower optical waveguide layer and a fourth AlGaN composition gradient layer which is formed between the upper optical waveguide layer and the upper clad layer and so that a band gap thereof continuously changes from the upper optical waveguide layer to the upper clad layer.

It is desirable that the above-mentioned first semiconductor laser element in accordance with the invention has an equivalent refractive index difference which is not less than 0.002 and not more than 0.01 in the case where a stripe width is not less than 1 μm and not more than 2.5 μm and that it has an equivalent refractive index difference which is not less than 0.002 and not more than 0.015 in the case where a stripe width is not less than 2.5 μm.

The second semiconductor laser element in accordance with the invention is composed of a GaN layer and at least a lower clad layer, a lower optical waveguide layer, an active layer, an upper optical waveguide layer, an upper clad layer, and a GaN contact layer all of which are laminated on the GaN layer in this order, is provided with a current injection window having a predetermined stripe width above the active layer, and is further composed of the first AlGaN/GaN quantum well gradient layer which is formed between the GaN layer and the lower clad layer and which has an energy gap larger than the GaN layer and smaller than the lower clad layer and/or the second AlGaN/GaN quantum well gradient layer which is formed between the upper clad layer and the GaN contact layer and which has an energy gap larger than the upper clad layer and smaller than the GaN contact layer.

Here the term, "the energy gap" refers to a substantial energy gap, and the term "the energy gap in the quantum well gradient layer" refers to a substantial energy gap obtained in consideration of a tunnel effect.

That is, in the second semiconductor laser element in accordance with the invention, a difference in the energy gap between the neighboring layers is reduced by providing the AlGaN/GaN quantum well gradient layer having an energy gap of intermediate magnitude between the energy gaps of the upper and lower layers, the upper and lower layers being the GaN layer and the lower clad layer and/or the contact layer and the upper clad layer.

Here, the quantum well gradient layer is composed of at least one quantum well layer and a pair of barrier layers sandwiching the quantum well layer. The quantum well gradient layer may be a single quantum well gradient layer having an energy gap connected stepwise to the energy gaps of the upper and lower layers, or may include multiple quantum well gradient layers. Also, in the case of the multiple quantum well gradient layers, the respective multiple layers may be constituted so that the energy gaps of the respective multiple layers continuously change and connect the energy gap between the upper and lower layers.

It is desirable that the second semiconductor laser element in accordance with the invention is further composed of the third AlGaN/GaN quantum well gradient layer which is formed between the lower clad layer and the lower optical waveguide layer and which has a band gap smaller than the lower clad layer and larger than the optical waveguide layer, and/or the fourth AlGaN/GaN quantum well gradient layer which is formed between the upper optical waveguide layer and the upper clad layer and which has a band gap smaller than the upper clad layer and larger than the upper optical waveguide layer.

Also in this case, as described above, the respective quantum well gradient layers may be a single quantum well gradient layer or may include multiple quantum well gradient layers. Also, in the case of the multiple quantum well gradient layers, the respective multiple layers may be constituted so that the energy gaps of the respective multiple layers change in a stepwise or continuous manner.

Of the barrier layers and the quantum layers constituting the respective quantum well gradient layers, only the barrier layers may be doped with impurities or both of the barrier layers and the quantum layers may be doped with impurities.

It is desirable in the second semiconductor laser element in accordance with the invention that the above-mentioned stripe width is not less than 1 μm and not more than 2.5 μm and that an equivalent refractive index difference is not less than 0.002 and not more than 0.01 or that the above-mentioned stripe width is not less than 2.5 μm and that an equivalent refractive index difference is not less than 0.002 and not more than 0.015.

Since the first semiconductor laser element in accordance with the invention includes the first AlGaN composition gradient layer which is formed between the GaN layer and the lower clad layer so that the band gap thereof continuously changes from the GaN layer to the lower clad layer and the second AlGaN composition gradient layer which is formed between the upper clad layer and the GaN contact layer so that the band gap thereof continuously changes from the upper clad layer to the GaN contact layer, the height of the barrier can be reduced because of the band offset produced between two layers sandwiching the composition gradient layer. This reduces the element resistance preventing a deterioration in characteristic caused by heat generation. Therefore, the characteristic and reliability of the semiconductor laser element can be improved providing a beam of high quality.

Further, since the first semiconductor laser element in accordance with the invention may include the third AlGaN/GaN composition gradient layer which is formed between the lower clad layer and the lower optical waveguide layer and which has a continuously changing band gap and/or the fourth AlGaN/GaN composition gradient layer which is formed between the upper optical waveguide layer and the upper clad layer and which has a continuously changing band gap, the height of the barrier can be reduced in the same way as described above because of the band offset produced between two layers sandwiching the composition gradient layer. This reduces the element resistance. Therefore, the characteristic and reliability of the semiconductor laser element can be improved providing a beam of high quality.

Since the first semiconductor laser element in accordance with the present invention has a stripe width of not less than 1 μm and not more than 2.5 μm and an equivalent refractive index difference of not less than 0.002 and not more than 0.01, it can produce a fundamental transverse mode oscillation of high quality. Also, since the first semiconductor laser element in accordance with the invention has a stripe width of not less than 2.5 μm and an equivalent refractive index difference of not less than 0.002 and not more than 0.015, it can produce a stable oscillation mode even if multiple modes are included.

Since the second semiconductor laser element in accordance with the invention includes the first AlGaN/GaN quantum well gradient layer which is formed between the GaN layer and the lower clad layer and which has an energy gap larger than the GaN layer and smaller than the lower clad layer and/or the second AlGaN/GaN quantum well gradient layer which is formed between the upper clad layer and the GaN contact layer and which has an energy gap larger than the GaN contact layer and smaller than the upper clad layer, the height of the barrier can be reduced because of the band offset produced between two layers sandwiching the quantum well gradient layer. This reduces the element resistance as a whole preventing a deterioration in characteristic caused by heat generation. Therefore, the characteristic and reliability of the semiconductor laser element can be improved providing a beam of high quality.

Further, the second semiconductor laser element in accordance with the invention may include the third AlGaN/GaN quantum well gradient layer which is formed between the lower clad layer and the lower optical waveguide layer and which has a band gap smaller than the lower clad layer and larger than the optical waveguide layer, and/or the fourth AlGaN/GaN quantum well gradient layer which is formed between the upper optical waveguide layer and the upper clad layer and which has a band gap smaller than the upper clad layer and larger than the upper optical waveguide layer, the height of the barrier can be reduced in the same way as described above because of the band offset produced between two layers sandwiching the GaN contact layer gradient layer. This reduces the element resistance. Therefore, the characteristic and reliability of the semiconductor laser element can be improved providing a beam of high quality.

Still further, since the second semiconductor laser element in accordance with the invention has a stripe width of not less than 1 μm and not more than 2.5 μm and an equivalent refractive index difference of not less than 0.002 and not more than 0.01, it can produce a fundamental transverse mode oscillation of high quality.

Still further, since the second semiconductor laser element in accordance with the invention has a stripe width of not less than 2.5 μm and an equivalent refractive index difference of not less than 0.002 and not more than 0.015, it can produce multiple modes being as a whole stable oscillation mode with little noises.

BRIEF DESCRIPTION OF THE DRAWINGS

FIG. 1 is a cross-sectional view showing a semiconductor laser element in accordance with the first preferred embodiment of the invention;

FIG. 4 is a cross-sectional view showing a semiconductor laser element in accordance with the second preferred embodiment of the invention;

DESCRIPTION OF THE PREFERRED EMBODIMENTS

Figure 2:
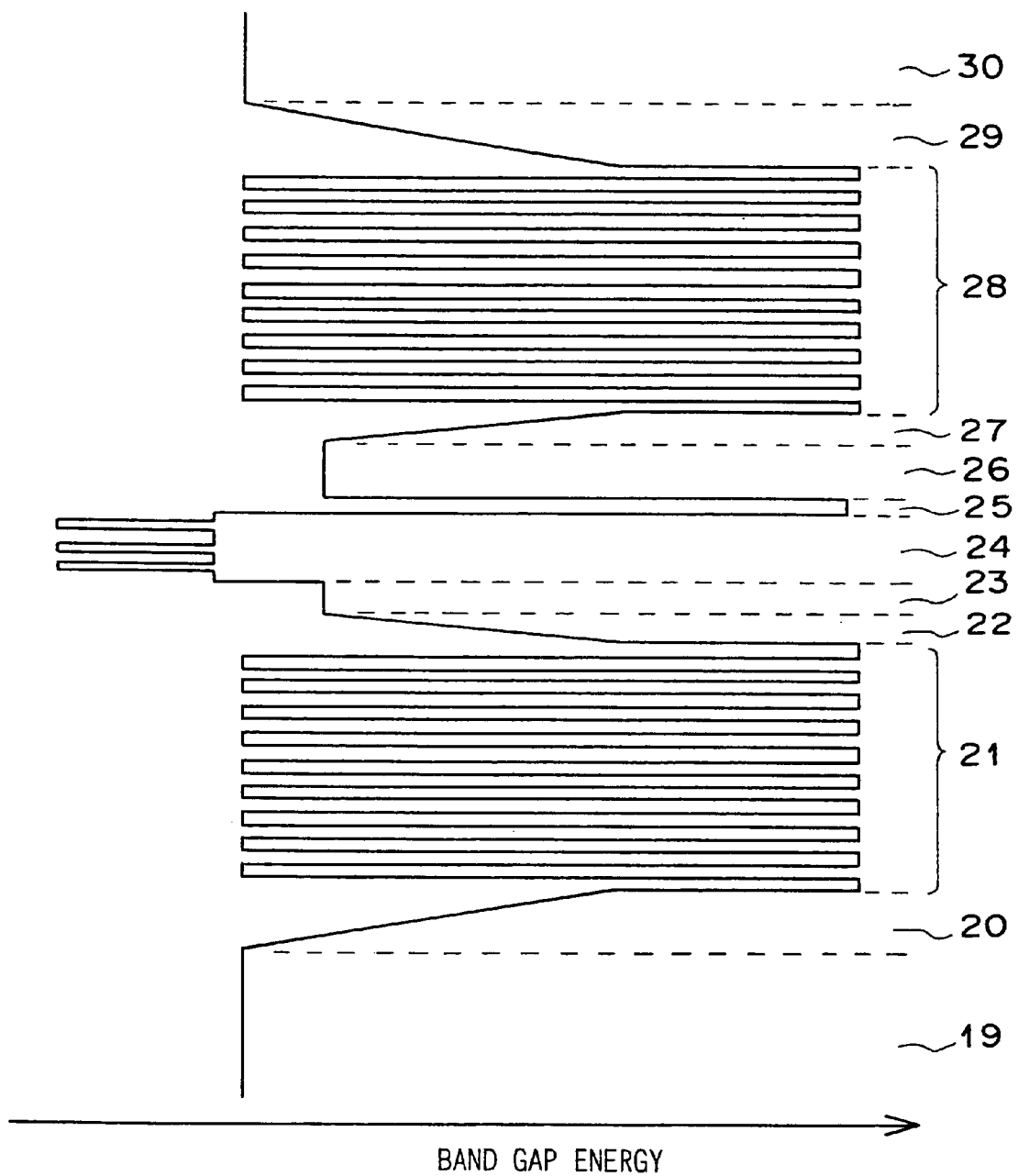
FIG. 2 is an illustration showing a band gap energy of a semiconductor laser element in accordance with the first preferred embodiment of the invention.

The preferred embodiments of the invention will be described in detail with reference to the accompanying drawings.

A semiconductor laser element in accordance with the first preferred embodiment of the invention will be described along with the cross-sectional view of the semiconductor laser element shown in FIG. 1. Trimethylgallium (TMG), trimetyl indium (TMI), trimethyl aluminum (TMA), and ammonia are used as growth materials and a silane gas is used as an n-type dopant and a cyclopentadienylmagnesium ($Cp_2Mg$) is used as a p-type dopant. As shown in FIG. 1, a GaN buffer layer 12 is formed on a (0001) plane sapphire substrate 11 in a thickness of about 20 nm at a temperature of 500° C. through a metal organic chemical vapor deposition method. Subsequently, a GaN layer 13 is grown to a thickness of about 2 μm at a temperature of 1050° C. Then, a $SiO_2$ film 14 (not shown) is formed and a resist 15 (not shown) is applied thereto. Subsequently, the $SiO_2$ film 14 (not shown) is removed, by the use of an ordinary lithography, in the direction of $$<1\bar{1}00> \quad \text{(Expression 1)}$$

of the substrate in the form of stripes each having a width of 3 μm at intervals of about 10 μm to form a line and space pattern. The GaN layer 12 and the GaN layer 13 are removed through dry etching to the extent of the top surface of the sapphire substrate 11 by using the resist 15 and the $SiO_2$ film 14 as a mask and using a chlorine-based gas. At this time, the sapphire substrate 11 may be etched. After the resist 15 (not shown) and the $SiO_2$ film 14 (not shown) are removed, a GaN layer 16 is selectively grown in a thickness of about 10 μm. At this time, the GaN layer 16 is grown in the transverse direction to connect the respective stripes to each other, whereby the surface of the GaN layer 16 is finally leveled. Next, an $SiO_2$ film 17 is formed thereon and then the $SiO_2$ film 17 is removed through the ordinary lithography in the form of stripes leaving regions each covering a portion under which the GaN layer 13 lies and having a width of about 7 μm. Subsequently, a GaN layer 18 is further grown thereon. The GaN layer 18 is grown also in the transverse direction to finally connect the stripes to each other, whereby the surface of the GaN layer 46 is finally leveled.

Subsequently, an n-GaN contact layer 19, an n-$Ga_{1-Z4}Al_{Z4}N$ composition gradient layer 20 (thickness: about 0.2 μm), an n-$Ga_{1-Z1}Al_{Z1}N$/GaN superlattice clad layer 21, an n-$Ga_{1-Z5}Al_{Z5}N$ composition gradient layer 22 (thickness: about 0.1 μm), an n- or i-$Ga_{1-Z2}Al_{Z2}N$ optical waveguide layer 23, an $In_{x2}Ga_{1-x2}N$ (doped with Si)/$In_{x1}Ga_{1-x1}N$ multiple quantum well active layer (0.5>x1>x2≧0) 24, a p-$Ga_{1-Z3}Al_{Z3}N$ carrier blocking layer 25, a p- or i-$Ga_{1-Z2}Al_{Z2}N$ optical waveguide layer 26, a p-$Ga_{1-Z5}Al_{Z5}N$ composition gradient layer 27 (thickness: about 0.1 μm), a p-$Ga_{1-Z1}Al_{Z1}N$/GaN superlattice upper clad layer 28, a p-$Ga_{1-Z4}Al_{Z4}N$ composition gradient layer 29 (thickness: about 0.2 μm), and a p-GaN contact layer 30 are grown. Subsequently, an $SiO_2$ film 31 (not shown) and a resist (not shown) are formed thereon and then the resist and the $SiO_2$ film 31 are removed through the ordinary lithography in the form of stripes leaving stripe regions each having a width of 1 μm to 2.5 μm. The p-$Ga_{1-Z1}Al_{Z1}N$/GaN superlattice clad layer 28 is selectively etched to the middle of the layer by means of a reactive ion etching apparatus (RIE) using the resist and the $SiO_2$ film 31, which are left in the form of stripes, as a mask to thereby form ridge portions. The p-$Ga_{1-Z1}Al_{Z1}N$/GaN superlattice clad layer 28 is left in a thickness capable of achieving a fundamental transverse mode oscillation.

Next, the resist (not shown) and $SiO_2$ film 31 (not shown) are removed. Subsequently, an $SiO_2$ film (not shown) and a resist (not shown) are formed and then the $SiO_2$ film and the resist are removed through the ordinary lithography from the regions outside the above-mentioned stripe region and outside a region of 20 μm in width from the respective side ends of the stripe region in the direction of width of the stripe region. Then, the laminated layers are etched away to the level where the n-GaN contact layer 19 is exposed, using the remaining $SiO_2$ film and resist as a mask by means of the RIE. Thereafter, the resist (not shown) and the $SiO_2$ film 31 (not shown) are all removed.

Next, an insulating film 32 is formed thereon and n-electrodes 36 made of Ti/Al are formed. Also, p-electrodes 34 made of Ni/Au are formed in the form of stripes on the surface of the p-type contact layer 30. Thereafter, a high reflection coat and a low reflection coat are applied to the surfaces of resonators formed by grinding the substrate and cleaving a sample and then the substrate is divided into chips to form semiconductor laser elements.

Assume that the compositions of AlGaNs described above satisfy the following conditions: 0≦z2<z1<1 and z2<z3<0.4; Z4 is continuously changed from zero to a composition corresponding to the band gap of the superlattice clad layer; Z5 is continuously changed from z2 to a composition corresponding to the band gap of the superlattice clad layer.

Further, assuming that an equivalent refractive index of light propagating in the direction perpendicular to the bottom side of a ridge is nA and that an equivalent refractive index of light propagating in the direction perpendicular to a ridge portion is nB, an equivalent refractive index difference expressed by nB−nA can be controlled in the range of $$2\times10^{-3} < nB-nA < 1\times10^{-2}$$

by controlling the thickness of the upper clad layer 28.

A wavelength λ oscillated by the above-mentioned semiconductor laser element can be controlled in the range of $$360 \text{ nm} < \lambda < 550 \text{ nm}$$

by controlling the composition of the active layer.

A molecular beam epitaxial growth method using a solid or a gas as a raw material may be used as a method of growing the respective layers described above.

Although an n-type substrate is used in the present preferred embodiment, a p-type substrate may instead be used. In that case, the conductivities of the respective layers are inverted (i.e., a p-type conductivity is replaced by an n-type conductivity).

Although a refractive index guiding type laser of a ridge structure has been described in the present preferred embodiment, the invention can be applied also to a laser having a current confining structure therein and a laser having a refractive index guiding type mechanism with a built-in ridge structure.

Although a sapphire substrate has been used as a substrate in the present preferred embodiment, an SiC substrate, a ZnO substrate, an $LiGaO_2$ substrate, an $LiAlO_2$ substrate, a GaAs substrate, a GaP substrate, a Ge substrate, or an Si substrate may be used.

Further, layers in accordance with the invention may be formed on a conductive GaN substrate from which a sapphire substrate has been removed.

Further, although a semiconductor laser oscillating a fundamental transverse mode has been described in the present preferred embodiment, a wide-stripe semiconductor laser having a stripe width of 2.5 µm or more and a low noise level may be formed, and this semiconductor laser can be used also as an exciting light source for a frequency conversion element or a fiber laser.

Since an AlGaN composition gradient layer in which a band gap continuously changes is provided in the present preferred embodiment, the barrier height caused by a band offset can be reduced and hence an element resistance can be reduced. Therefore, the heat generation of the element can be reduced to improve the reliability of the element providing a Gaussian beam of high quality.

Next, the band gap energy of a semiconductor laser element in accordance with the above-mentioned first preferred embodiment of the invention will be described referring to FIG. 2. Reference numerals correspond to those in FIG. 1 and the description thereof will be omitted.

As shown in FIG. 2, Z4 in the n-$Ga_{1-Z4}Al_{Z4}N$ composition gradient layer 20 continuously increases a band gap energy from the band gap energy of the n-GaN contact layer 19 to the band gap energy in the n-$Ga_{1-Z1}Al_{Z1}N$/GaN superlattice clad layer 21.

Further, z5 in the n-$Ga_{1-Z5}Al_{Z5}N$ composition gradient layer 22 continuously deccreases a band gap energy from the band gap energy of the n-$Ga_{1-Z1}Al_{Z1}N$/GaN superlattice clad layer 21 to the band gap energy of the n- or i-$Ga_{1-Z2}Al_{Z2}N$ optical waveguide layer 23.

Still further, Z5 in the p-$Ga_{1-Z5}Al_{Z5}N$ composition gradient layer 27 continuously increases a band gap energy from the band gap energy of the p or i-$Ga_{1-Z2}Al_{Z2}N$ optical waveguide layer 26 to the band gap energy of the p-$Ga_{1-Z1}Al_{Z1}N$/GaN superlattice clad layer 28.

Still further, z4 in the p-$Ga_{1-Z4}Al_{Z4}N$ composition gradient layer 29 continuously decreases a band gap energy from the band gap energy of the p-$Ga_{1-Z1}Al_{Z1}N$/GaN superlattice clad layer 28 to the band gap energy of the p-GaN contact layer 30.

As described above, it is desirable that the compositions of the composition gradient layers are determined such that the band gaps of the respective gradient layers substantially agree with those of the neighboring clad layers or optical waveguide layers at the respective interfaces thereof.

Next, the element resistance of the semiconductor laser element for the case where the AlGaN composition gradient layer is used and for the case where the AlGaN composition gradient layer is not used will be described referring to FIG. 3.

Figure 3:
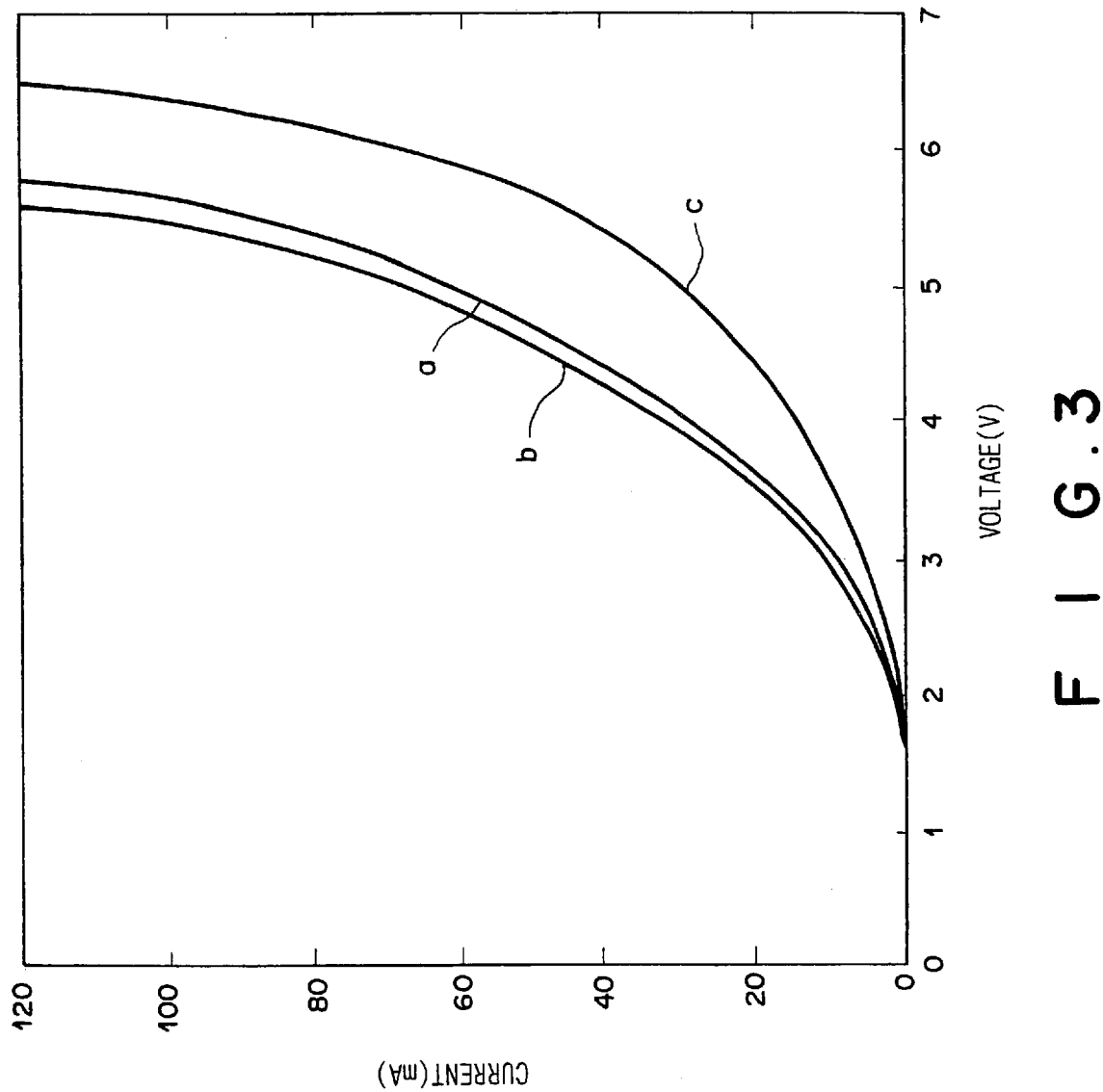
FIG. 3 is a diagram showing the voltage-current characteristics of a semiconductor laser element for the case where an AlGaN composition gradient layer is used and for the case where the AlGaN composition gradient layer is not used.

The semiconductor laser element used for the evaluation shown in FIG. 3 is obtained by setting the compositions of the semiconductor laser element of the above-mentioned first preferred embodiment at the following values: z1=0.14, z2=0, z3=0.15, x1=0.14, x2=0.02, and the mean composition of the superlattice clad layer=0.07. The size of an electrode is 5 µm×500 µm. A reference character (c) in FIG. 3 designates a semiconductor laser element having no AlGaN composition gradient layers 20, 22, 27, and 29 in the above-mentioned semiconductor laser element. Further, a reference character (a) in FIG. 3 designates a semiconductor laser element having the AlGaN composition gradient layers only between the superlattice clad layer 21 and the n-GaN layer 19 and between the superlattice clad layer 28 and the n-GaN contact layer 30. Still further, a reference character (b) in FIG. 3 designates a semiconductor laser element having an AlGaN composition gradient layer between the n- or i-$Ga_{1-Z2}Al_{Z2}N$ optical waveguide layer 23 and the superlattice clad layer 21 and another AlGaN composition gradient layer between the p- or i-$Ga_{1-Z2}Al_{Z2}N$ optical waveguide layer 26 and the superlattice clad layer 28, in addition to the composition of the reference character (a).

As shown in FIG. 3, the element resistance decreases in the case of (a) and (b) where the AlGaN composition gradient layers are provided as compared with the case of (c) where the AlGaN composition gradient layer is not provided. Also, the element resistance further decreases in the case of (b) where the additional AlGaN composition gradient layer is further provided between the optical waveguide layer and the superlattice clad layer, as compared with the case of (a), which reveals that the composition (b) is more desirable.

Next, a semiconductor laser element in accordance with the second preferred embodiment of the invention is described. The cross-sectional view of the semiconductor laser element is shown in FIG. 4.

Trimethylgallium (TMG), trimetylindium (TMI), trimethylaluminum (TMA), and ammonia are used as growth materials and a silane gas is used as an n-type dopant gas and acyclopentadienylmagnesium (Cp2Mg) is used as a p-type dopant. As shown in FIG. 4, a GaN buffer layer 42 is formed on a (0001) plane sapphire substrate 41 in a thickness of about 20 nm at a temperature of 500° C. by a metal organic chemical vapor deposition method. Subsequently, a GaN layer 43 is grown to a thickness of about 2 µm at a temperature of 1050° C. Then, a $SiO_2$ film (not shown) is formed and then a resist (not shown) is applied thereto. Subsequently, the $SiO_2$ film is removed, by the use of an ordinary lithography, in the direction of $$<1\bar{1}00> \qquad \text{(Expression 1)}$$

of the substrate in the form of stripes each having a width of 5 µm at intervals of about 10 µm to form a line and space pattern. Parts of the GaN buffer layer 42 and the GaN layer 43 are removed through dry etching to the extent of the top surface of the sapphire substrate 41 by using the resist and the $SiO_2$ film as a mask and using a chlorine based gas. At this time, the sapphire substrate 41 may be etched. After the resist and the $SiO_2$ film are removed, a GaN layer 46 is selectively grown to a thickness of about 10 µm on the GaN layer 43 and the exposed sapphire substrate 41. At this time, the GaN layer 46 is grown in the transverse direction with the exposed portion of the sapphire substrate 41 as the nucleus of growth, whereby the surface of the GaN layer 46 is finally leveled. Next, a $SiO_2$ film 47 is formed thereon and then the $SiO_2$ film 47 is removed through the ordinary lithography in the form of stripes to leave regions each covering a portion under which the GaN layer 43 lies and having a width of about 7 µm. Subsequently, a GaN layer 48 is further grown on the $SiO_2$ film 47 and the exposed GaN layer 46. The GaN layer 48 is grown in the transverse direction taking the exposed portion of the GaN layer 46 as the nucleus of growth, whereby the surface of the GaN layer 48 is finally leveled.

Formed subsequently on the GaN layer 48 are an n-GaN contact layer 49, an n-$Ga_{1-Z3}Al_{Z3}N$ (2.5 nm)/GaN (2.5 nm) multiple quantum well step-gradient layer 50 (about 0.1 µm), which is the first quantum well gradient layer, an n-$Ga_{1-Z1}Al_{Z1}N$ (2.5 nm)/GaN (2.5 nm) superlattice clad layer 51, which is a lower clad layer, an n-$Ga_{1-Z4}Al_{Z4}N$ (2.5 nm)/GaN (2.5 nm) multiple quantum well step-gradient layer 52 (about 0.1 µm), which is the third quantum well gradient layer, an n-$Ga_{1-Z2}Al_{Z2}N$ optical waveguide layer 53, which is a lower optical waveguide layer, an $In_{x2}Ga_{1-x2}N$ (doped with Si)/$In_{x1}Ga_{1-x1}N$ multiple quantum well active layer (0.5>x1>x2≧0) 54, a p-$Ga_{1-Z5}Al_{Z5}N$ carrier blocking layer 55, a p-$Ga_{1-Z3}Al_{Z3}N$ optical waveguide layer 56, which is an upper optical waveguide layer, a p-$Ga_{1-Z4}Al_{Z4}N$ (2.5 nm)/GaN (2.5 nm) multiple quantum well step-gradient layer 57 (about 0.1 μm), which is the fourth quantum well gradient layer, a p-$Ga_{1-Z1}Al_{Z1}N$ (2.5 nm)/GaN (2.5 nm) superlattice clad layer 58, which is an upper clad layer, a p-$Ga_{1-Z3}Al_{Z3}N$ (2.5 nm)/GaN (2.5 nm) multiple quantum well step-gradient layer 59 (about 0.2 μm), which is the second quantum well gradient layer, and a p-GaN contact layer 60. Subsequently, an $SiO_2$ film (not shown) and a resist (not shown) are formed thereon and then the resist and the $SiO_2$ film are removed through the ordinary lithography in the form of stripes leaving stripe regions each having a width of 1 μm to 2.5 μm. The p-type superlattice clad layer 58 is selectively etched to the middle of the layer by means of a reactive ion etching apparatus (RIE) using the resist and the $SiO_2$ film 31, which are left in the form of stripes, as a mask to thereby form ridge portions. The thickness of the p-type superlattice clad layer 58 left after etching is a thickness capable of achieving a fundamental transverse mode oscillation.

Next, the resist and the $SiO_2$ film used as the mask when the above-mentioned ridge portions are formed are removed. Subsequently, an $SiO_2$ film (not shown) and a resist (not shown) are formed on the surface of the laminated layers and then the $SiO_2$ film and the resist are removed through the ordinary lithography from regions outside the above-mentioned stripe region and outside a region of 20 μm in width from the respective side ends of the stripe region in the direction of width of the stripe region. Then, the laminated layers are etched away to the level where the n-GaN contact layer 49 is exposed by using the remaining $SiO_2$ film and resist as a mask by means of the RIE. Thereafter, the resist and the $SiO_2$ film are all removed.

Next, an insulating film 62 is formed thereon and n-electrodes 66 made of Ti/Al in the form of stripes are formed on the exposed surface of the n-GaN layer 49. Also, p-electrodes 64 made of Ni/Au in the form of stripes are formed on the surface of the p-GaN contact layer 60. Thereafter, a high reflection coat and a low reflection coat are applied to the surfaces of resonators formed by grinding the substrate 41 and cleaving a sample and then the substrate 41 is divided into chips to form semiconductor laser elements.

Here, assume that the compositions of AlGaNs described above satisfy the conditions of: $0 \leq z2 < z1 < 1$, $z2 < z5$, and $z2 < z4$.

Further, assuming that an equivalent refractive index of light propagating in the direction perpendicular to the bottom side of a ridge is nA and that an equivalent refractive index of light propagating in the direction perpendicular to a ridge portion is nB, an equivalent refractive index difference expressed by nB−nA can be controlled in the range of $$2 \times 10^{-3} < nB - nA < 1 \times 10^{-2}$$

by controlling the thickness of the p-type superlattice clad layer 51, which is the upper clad layer.

Figure 5A:
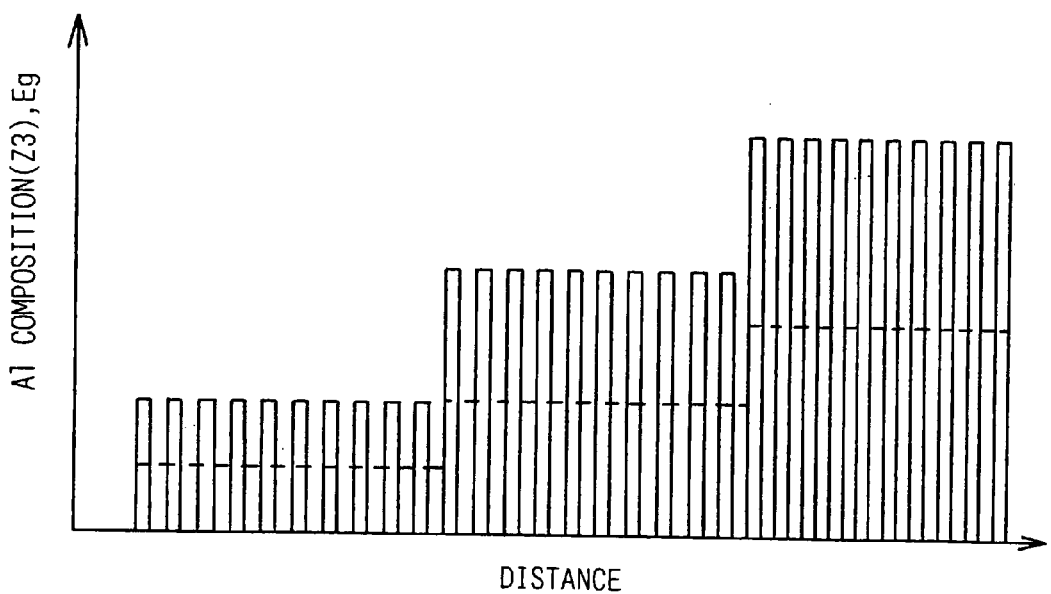
FIGS. 5A and 5B are illustrations showing the composition and the energy gap of a quantum well gradient layer in a semiconductor laser element in accordance with the second preferred embodiment of the invention.
Figure 5B:
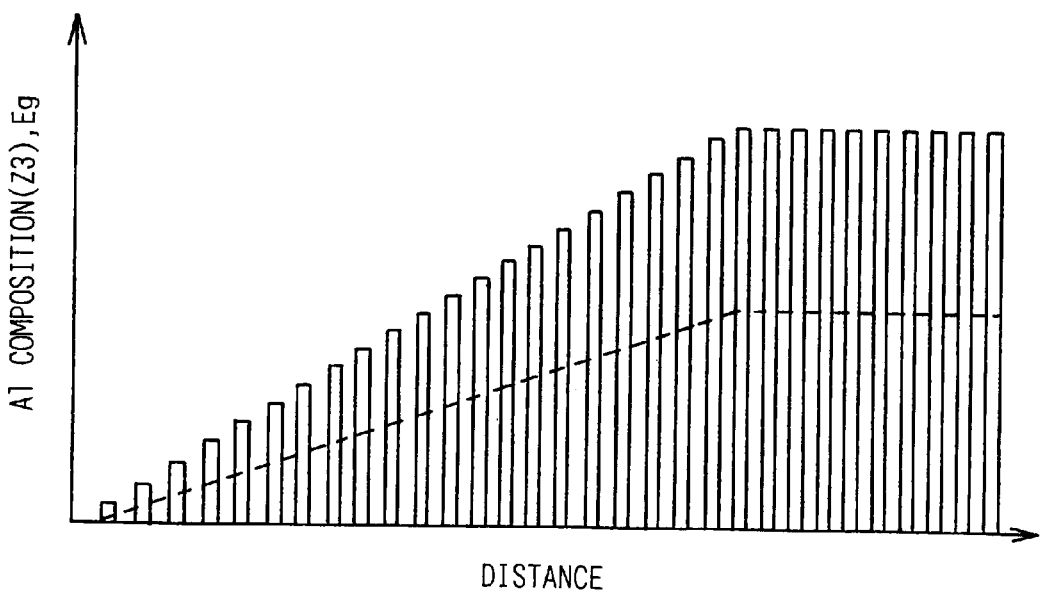

Shown In FIGS. 5A and 5B are specific examples of $Ga_{1-Z3}Al_{Z3}N$/GaN multiple quantum well step-gradient layers 50 and 59, each of which is the first quantum well gradient layer disposed between the n-GaN layer 49 and the n-type superlattice clad layer 51 or the second quantum well gradient layer disposed between the p-type superlattice clad layer 58 and the p-GaN contact layer 60. FIG. 5A is an embodiment of the $Ga_{1-Z3}Al_{Z3}N$/GaN multiple quantum well step-gradient layer in which an energy gap changes in a stepwise manner, and FIG. 5A is an embodiment of the $Ga_{1-Z3}Al_{Z3}N$/GaN multiple quantum well step-gradient layer in which an energy gap changes continuously.

In FIG. 5, a vertical axis indicates an aluminum composition (z3) and an energy gap (Eg) and a horizontal axis indicates a distance from a layer having a lower energy gap out of layers sandwiching a quantum well gradient layer. Here, the broken line in the diagram shows a substantial energy gap obtained in consideration of a quantum effect. The $Ga_{1-Z3}Al_{Z3}N$/GaN multiple quantum well gradient layer is composed of $Ga_{1-Z3}Al_{Z3}N$ barrier layers and GaN quantum well layers which are alternately disposed. In the case where the energy gap is increased, the energy gap increases as the Al composition z3 in the $Ga_{1-z3}Al_{Z3}N$ barrier layer is increased, whereas the energy gap decreases as the Al composition z3 of the $Ga_{1-Z3}Al_{Z3}N$ barrier layer is decreased. The energy gap may be increased in a stepwise manner as shown in FIG. 5A, on may be continuously changed as shown in FIG. 5B. For example, it is recommended that the substantial energy gap of the first quantum well gradient layer disposed between the n-GaN layer 49 and the n-type superlattice clad layer 51 be increased in a stepwise or continuous manner from the n-GaN layer 49 having a small energy gap to the n-type superlattice clad layer 51 having a large energy gap to connect the energy gap of the upper layer to the energy gap of the lower layer.

In this connection, although the above description refers to the first quantum well gradient layer disposed between the n-GaN layer 49 and the n-type superlattice clad layer 51 (or the second quantum well gradient layer disposed between the p-GaN contact layer 60 and the p-type superlattice clad layer 58), the substantial energy gaps of the third and fourth quantum well gradient layers, each of which is disposed between the optical waveguide layer and the clad layer, can also be changed in the same way by changing the Al composition z4 of the $Ga_{1-Z4}Al_{Z4}N$ barrier layer to connect the energy gap of the upper optical waveguide layer to the energy gap of the lower clad layer.

Here, it is desirable that the compositions of the composition gradient layers are determined such that the energy gaps of the respective gradient layers substantially agree with those of the neighboring clad layers or optical waveguide layers at the respective interfaces thereof.

As for a method of growing the respective layers, a molecular beam epitaxial growth method using a solid or a gas as a raw material may be used.

Although an n-type substrate is used in the present preferred embodiment, a p-type substrate may instead be used. In that case, the conductivities of the respective layers are inverted (i.e. a p-type conductivity is replaced by an n-type conductivity).

Although only the barrier layer of the gradient layer is doped in the above constitution, the quantum well layer may also be doped.

Although a refractive index guiding type laser having a ridge structure is used in the present preferred embodiment, the invention can be applied also to a laser having a current confining structure therein and a laser having a refractive index waveguide type mechanism with a built-in ridge structure.

A wavelength λ oscillated by the above-mentioned semiconductor laser element can be controlled within the range of $$360 \text{ nm} < \lambda < 550 \text{ nm}$$

by controlling the composition of the active layer.

Although a sapphire substrate is used as a substrate in the above embodiment, an SiC substrate, a ZnO substrate, an LiGaO$_2$ substrate, an LiAlO$_2$ substrate, a GaAs substrate, a GaP substrate, a Ge substrate, and an Si substrate may instead be used.

Further, layers in accordance with the invention may be formed by growing a conductive GaN layer on a sapphire substrate and then growing the other layers on the conductive GaN layer from which the sapphire substrate is removed.

Further, although a semiconductor laser described in the above embodiment works in a fundamental transverse mode, a wide-stripe semiconductor laser having a stripe width of 2.5 μm or more may be formed. Such a semiconductor laser element having the constitution in accordance with the invention can reduce noises even when working in multiple modes. This wide-stripe semiconductor laser can be also used as a preferred exciting light source for a frequency conversion element or a fiber laser.

Since a multiple quantum well step-gradient layer in which a band gap continuously changes is provided in the present preferred embodiment, the barrier height caused by a band offset and hence an element resistance can be reduced. Therefore, the heat generation of the element can be reduced to improve reliability and to provide a Gaussian beam of high quality.

Figure 6:
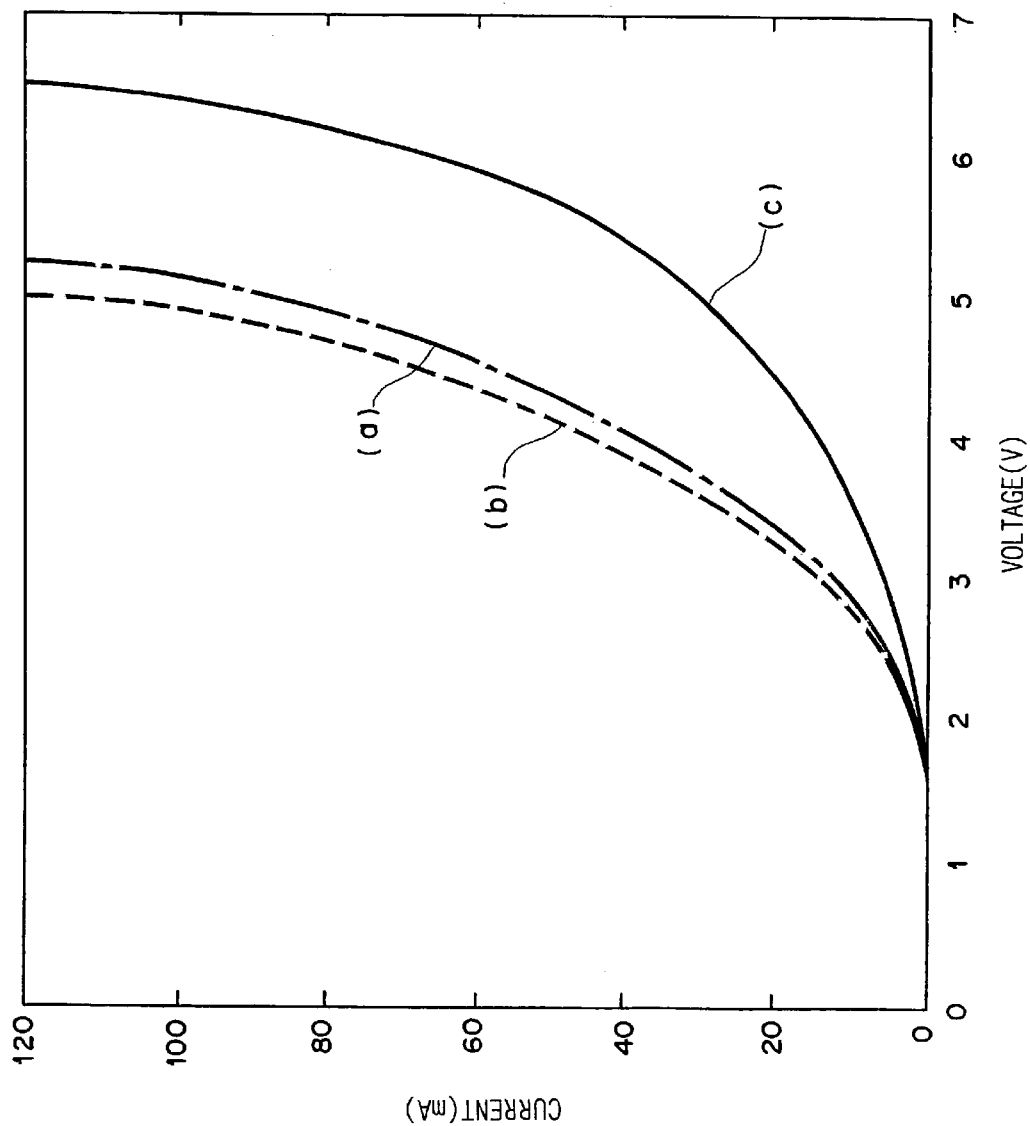
FIG. 6 is a diagram showing the voltage-current characteristics of a semiconductor laser element in the case where a quantum well gradient layer is used and in the case where the quantum well gradient layer is not used.

Next, shown in FIG. 6 are the voltage-current characteristics of a semiconductor laser for the case where a quantum well gradient layer is provided and for the case where the quantum well gradient layer is not provided.

The semiconductor laser element used for the evaluation shown in FIG. 6 is obtained by setting the compositions of the semiconductor laser element of the above-mentioned preferred embodiment at the values of: z1=0.16, x2=0.02, x1=0.14, z5=0.15, and z2=0. The size of an electrode is 5 μm×500 μm. A single dot and dash line (a) in FIG. 6 represents a semiconductor laser element having Ga$_{1-z3}$Al$_{z3}$N/GaN multiple quantum well step-gradient layers 50 and 59, the former of which is disposed between the n-GaN layer 49 and the superlattice clad layer 51 and the latter of which is disposed between the superlattice clad layer 58 and the p-GaN contact layer 60. A broken line (b) represents a semiconductor laser element having Ga$_{1-z3}$Al$_{z3}$N/GaN multiple quantum well step-gradient layers 50 and 59, the former of which is disposed between the n-GaN layer 49 and the superlattice clad layer 51 and the latter of which is disposed between the superlattice clad layer 58 and the p-GaN contact layer 60, and further having Ga$_{1-z4}$Al$_{z4}$N/GaN multiple quantum well step-gradient layers 52 and 57, each of which is provided between the optical waveguide layer 53 and the n-type superlattice clad layer 51 or between the optical waveguide layer 56 and the p-type superlattice clad layer 58. Here, in the Ga$_{1-z3}$Al$_{z3}$N/GaN multiple quantum well step-gradient layers 50 and 59, the energy gap changes in three steps of z3=0.12, 0.08 and 0.04, and ten barrier layers and ten quantum well layers are formed in the respective compositions. Further, a solid line (c) in FIG. 6 represents a semiconductor laser element having none of the quantum well step-gradient layers 50, 52, 57, and 59.

As is evident from the diagram shown in FIG. 6, the semiconductor laser elements (a) and (b) according to the invention having at least one quantum well gradient layer (quantum well step-gradient layer) have a sharper rise in the voltage-current characteristic as compared with the conventional semiconductor element (c) and hence can provide the same current at a lower voltage than the conventional element (c). Further, the element (b) having four quantum well gradient layers shows abetter characteristic than the element (a) having two quantum well gradient layers. It is thought that this is because the quantum well gradient layer reduces the resistance of the element.

In this manner, the semiconductor laser element in accordance with the present invention can reduce the resistance and the heat generation of the element to a level lower than that of the conventional semiconductor element, hence providing high reliability.

Further, the semiconductor laser element in accordance with the present invention having lower element resistance and a Gausssian beam of high quality can be applied to a light source of fields such as a high-speed information/image processing, communications, measurement, medical care, printing and the like.

While the invention has been described in connection with the preferred embodiments, it should be understood that the invention is not limited thereto. On the contrary, the invention covers all alternatives, modifications, and equivalents which may be included within the spirit and scope of the invention as defined by the appended claims.

What is claimed is:

1. A semiconductor laser element comprising:
    a GaN layer;
    a lower clad layer;
    a lower optical waveguide layer;
    an active layer;
    an upper optical waveguide layer;
    an upper clad layer;
    a GaN contact layer;
    wherein the lower clad layer, the lower optical waveguide layer, the active layer, the upper optical waveguide layer, the upper clad layer, and the GaN contact layer are laminated on the GaN layer in this order and wherein a current injection window is provided above the active layer, further comprising
        a first AlGaN composition gradient layer which is provided between the GaN layer and the lower clad layer so that a band gap thereof continuously changes from the GaN layer to the lower clad layer; and
        a second AlGaN composition gradient layer which is provided between the upper clad layer and the GaN contact layer so that a band gap thereof continuously changes from the upper clad layer to the GaN contact layer.

2. A semiconductor laser element as claimed in claim 1, further comprising:
    a third AlGaN composition gradient layer which is provided between the lower clad layer and the lower optical waveguide layer so that a band gap thereof continuously changes from the lower clad layer to the lower optical waveguide layer; and
    a fourth AlGaN composition gradient layer which is provided between the upper optical waveguide layer and the upper clad layer and so that a band gap thereof continuously changes from the upper optical waveguide layer to the upper clad layer.

3. A semiconductor laser element as claimed in claim 1, wherein a stripe width of the current injection window is not less than 1 μm and not more than 2.5 μm, and wherein an equivalent refractive index difference is not less than 0.002 and not more than 0.01.

4. A semiconductor laser element as claimed in claim 2, wherein a stripe width of the current injection window is not less than 1 μm and not more than 2.5 μm, and wherein an equivalent refractive index difference is not less than 0.002 and not more than 0.01.

5. A semiconductor laser element as claimed in claim 1, wherein a stripe width of the current injection window is not less than 2.5 µm, and wherein an equivalent refractive index difference is not less than 0.002 and not more than 0.015.

6. A semiconductor laser element as claimed in claim 2, wherein a stripe width of the current injection window is not less than 2.5 µm, and wherein an equivalent refractive index difference is not less than 0.002 and not more than 0.015.

7. A semiconductor laser element comprising:
   a GaN layer;
   a lower clad layer;
   a lower optical waveguide layer;
   an active layer;
   an upper optical waveguide layer;
   an upper clad layer;
   a GaN contact layer;
   wherein the lower clad layer, the lower optical waveguide layer, the active layer, the upper optical waveguide layer, the upper clad layer, and the GaN contact layer are laminated on the GaN layer in this order and wherein a current injection window having a predetermined stripe width is provided above the active layer, further comprising
      a first AlGaN/GaN quantum well gradient layer which is provided between the GaN layer and the lower clad layer and which has an energy gap larger than the GaN layer and smaller than the lower clad layer; and/or
      a second AlGaN/GaN quantum well gradient layer which is provided between the upper clad layer and the GaN contact layer and which has an energy gap larger than the GaN contact layer and smaller than the upper clad layer.

8. A semiconductor laser element as claimed in claim 7, further comprising:
   a third AlGaN/GaN quantum well gradient layer which is provided between the lower clad layer and the lower optical waveguide layer and which has an energy gap smaller than the lower clad layer and larger than the lower optical waveguide layer; and/or
   a fourth AlGaN/GaN quantum well gradient layer which is provided between the upper optical waveguide layer and the upper clad layer and which has an energy gap smaller than the upper clad layer and larger than the upper optical waveguide layer.

9. A semiconductor laser element as claimed in claim 7, wherein, of barrier layers and quantum well layers constituting the respective quantum well gradient layers, only the barrier layers or both of the barrier layers and the quantum well layers are doped with impurities.

10. A semiconductor laser element as claimed in claim 8, wherein, of barrier layers and quantum well layers constituting the respective quantum well gradient layers, only the barrier layers or both of the barrier layers and the quantum well layers are doped with impurities.

11. A semiconductor laser element as claimed in claim 7, wherein the stripe width is not less than 1 µm and not more than 2.5 µm, and wherein an equivalent refractive index difference is not less than 0.002 and not more than 0.01.

12. A semiconductor laser element as claimed in claim 8, wherein the stripe width is not less than 1 µm and not more than 2.5 µm, and wherein an equivalent refractive index difference is not less than 0.002 and not more than 0.01.

13. A semiconductor laser element as claimed in claim 9, wherein the stripe width is not less than 1 µm and not more than 2.5 µm, and wherein an equivalent refractive index difference is not less than 0.002 and not more than 0.01.

14. A semiconductor laser element as claimed in claim 10, wherein the stripe width is not less than 1 µm and not more than 2.5 µm, and wherein an equivalent refractive index difference is not less than 0.002 and not more than 0.01.

15. A semiconductor laser element as claimed in claim 7, wherein the stripe width is not less than 2.5 µm, and wherein an equivalent refractive index difference is not less than 0.002 and not more than 0.015.

16. A semiconductor laser element as claimed in claim 8, wherein the stripe width is not less than 2.5 µm, and wherein an equivalent refractive index difference is not less than 0.002 and not more than 0.015.

17. A semiconductor laser element as claimed in claim 9, wherein the stripe width is not less than 2.5 µm, and wherein an equivalent refractive index difference is not less than 0.002 and not more than 0.015.

18. A semiconductor laser element as claimed in claim 10, wherein the stripe width is not less than 2.5 µm, and wherein an equivalent refractive index difference is not less than 0.002 and not more than 0.015.

* * * * *